(12) United States Patent
Thomas et al.

(10) Patent No.: US 9,709,901 B2
(45) Date of Patent: Jul. 18, 2017

(54) LITHOGRAPHIC APPARATUS AND A METHOD OF OPERATING THE APPARATUS

(71) Applicant: ASML NETHERLANDS B.V., Veldhoven (NL)

(72) Inventors: Ivo Adam Johannes Thomas, Son (NL); Siebe Landheer, Eindhoven (NL); Arnout Johannes Meester, Eindhoven (NL); Marcio Alexandre Cano Miranda, Eindhoven (NL); Gheorghe Tanasa, Eindhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 69 days.

(21) Appl. No.: 14/586,390

(22) Filed: Dec. 30, 2014

(65) Prior Publication Data
US 2015/0109592 A1    Apr. 23, 2015

Related U.S. Application Data

(63) Continuation of application No. 12/770,356, filed on Apr. 29, 2010, now Pat. No. 8,928,857.

(60) Provisional application No. 61/174,793, filed on May 1, 2009.

(51) Int. Cl.
*G03B 27/52* (2006.01)
*G03B 27/42* (2006.01)
*G03F 7/20* (2006.01)

(52) U.S. Cl.
CPC ......... *G03F 7/70341* (2013.01); *G03B 27/52* (2013.01); *G03F 7/70891* (2013.01)

(58) Field of Classification Search
CPC .. G03F 7/70341; G03F 7/7015; G03F 7/2041; G03F 7/70916; G03F 7/70925; G03F 7/20; G03F 1/56; G03B 27/522; G02B 17/0892; G02B 1/105
See application file for complete search history.

(56) References Cited

U.S. PATENT DOCUMENTS

| | | | |
|---|---|---|---|
| 4,509,852 | A | 4/1985 | Tabarelli et al. |
| 6,954,256 | B2 | 10/2005 | Flagello et al. |
| 7,321,415 | B2 | 1/2008 | Hazelton et al. |
| 7,405,805 | B2 | 7/2008 | Uitterdijk et al. |

(Continued)

FOREIGN PATENT DOCUMENTS

| | | |
|---|---|---|
| EP | 1 420 300 | 5/2004 |
| EP | 1 610 361 | 12/2005 |

(Continued)

OTHER PUBLICATIONS

Japanese Office Action mailed Mar. 1, 2012 in corresponding Japanese Patent Application No. 2010-099338.

(Continued)

*Primary Examiner* — Mesfin Asfaw
(74) *Attorney, Agent, or Firm* — Pillsbury Winthrop Shaw Pittman LLP

(57) ABSTRACT

A lithographic apparatus comprising a projection system, and a liquid confinement structure configured to at least partly confine immersion liquid to an immersion space defined by the projection system, the liquid confinement structure and a substrate and/or substrate table is disclosed wherein a measure is taken to reduce the effect of droplets and/or a liquid film on the last element of the projection system.

20 Claims, 4 Drawing Sheets

(56) References Cited

U.S. PATENT DOCUMENTS

| | | |
|---|---|---|
| 7,411,653 B2 | 8/2008 | Hoogendam et al. |
| 7,684,008 B2 | 3/2010 | De Smit et al. |
| 2004/0136494 A1 | 7/2004 | Lof et al. |
| 2004/0207824 A1 | 10/2004 | Lof et al. |
| 2005/0024609 A1 | 2/2005 | De Smit et al. |
| 2005/0094119 A1 | 5/2005 | Loopstra et al. |
| 2005/0128445 A1 | 6/2005 | Hoogendam et al. |
| 2005/0280789 A1 | 12/2005 | Bruls et al. |
| 2006/0017894 A1 | 1/2006 | Van Empel et al. |
| 2006/0038968 A1 | 2/2006 | Kemper et al. |
| 2006/0119809 A1 | 6/2006 | Verhagen et al. |
| 2006/0139589 A1 | 6/2006 | Uitterdijk et al. |
| 2006/0158627 A1 | 7/2006 | Kemper et al. |
| 2007/0081140 A1 | 4/2007 | Beckers et al. |
| 2007/0201012 A1 | 8/2007 | Loopstra et al. |
| 2007/0216889 A1 | 9/2007 | Nishii |
| 2008/0106718 A1 | 5/2008 | Okada et al. |
| 2009/0059192 A1 | 3/2009 | Beckers et al. |
| 2009/0103070 A1 | 4/2009 | Shirai et al. |
| 2010/0066987 A1 | 3/2010 | Bruijstens et al. |
| 2010/0066988 A1 | 3/2010 | Bruijstens et al. |
| 2010/0296067 A1 | 11/2010 | Thomas et al. |

FOREIGN PATENT DOCUMENTS

| | | |
|---|---|---|
| EP | 1 736 831 | 12/2006 |
| JP | 2004-095654 | 3/2004 |
| JP | 2004-259966 | 9/2004 |
| JP | 2005-093997 | 4/2005 |
| JP | 2005-136413 | 5/2005 |
| JP | 2006-128192 | 5/2006 |
| JP | 2006-165285 | 6/2006 |
| JP | 2006-165500 | 6/2006 |
| JP | 2006-191066 | 7/2006 |
| JP | 2007-059556 | 3/2007 |
| JP | 2007-110109 | 4/2007 |
| JP | 2007-235088 | 9/2007 |
| JP | 2007-528115 | 10/2007 |
| JP | 2008-010892 | 1/2008 |
| JP | 2008-199069 | 8/2008 |
| JP | 2009-038373 | 2/2009 |
| JP | 2009-536452 | 10/2009 |
| JP | 2010-074160 | 4/2010 |
| KR | 2005-0110033 | 11/2005 |
| KR | 2006-0133917 | 12/2006 |
| TW | 200525290 | 8/2005 |
| WO | 99/49504 | 9/1999 |
| WO | 2005/064405 | 7/2005 |
| WO | 2005/119742 | 12/2005 |
| WO | 2007/128835 | 11/2007 |
| WO | 2008/031576 | 3/2008 |

OTHER PUBLICATIONS

U.S. Office Action mailed Nov. 8, 2012 in corresponding U.S. Appl. No. 12/559,664.
U.S. Office Action mailed Nov. 14, 2012 in corresponding U.S. Appl. No. 12/559,813.
U.S. Office Action dated Jul. 15, 2013 in corresponding U.S. Appl. No. 12/559,813.
U.S. Office Action dated May 8, 2014 in corresponding U.S. Appl. No. 12/559,664.
U.S. Office Action dated Aug. 21, 2014 in corresponding U.S. Appl. No. 12/559,664.
U.S. Office Action dated Jun. 7, 2013 in corresponding U.S. Appl. No. 12/770,356.
Japanese Office Action dated Oct. 26, 2011 in corresponding Japanese Patent Application No. 2009-208753.
Japanese Office Action dated Oct. 26, 2011 in corresponding Japanese Patent Application No. 2009-208754.
Korean Office Action dated Nov. 30, 2011 in corresponding Korean Patent Application No. 10-2009-0087463.
Japanese Office Action mailed Mar. 13, 2012 in corresponding Japanese Patent Application No. 2009-208754.

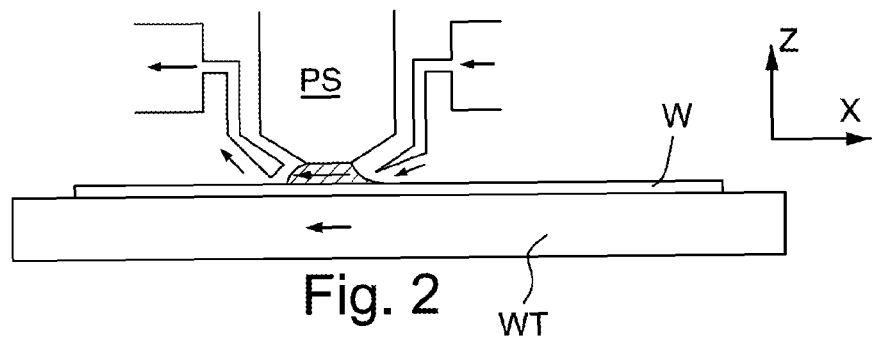
Fig. 2
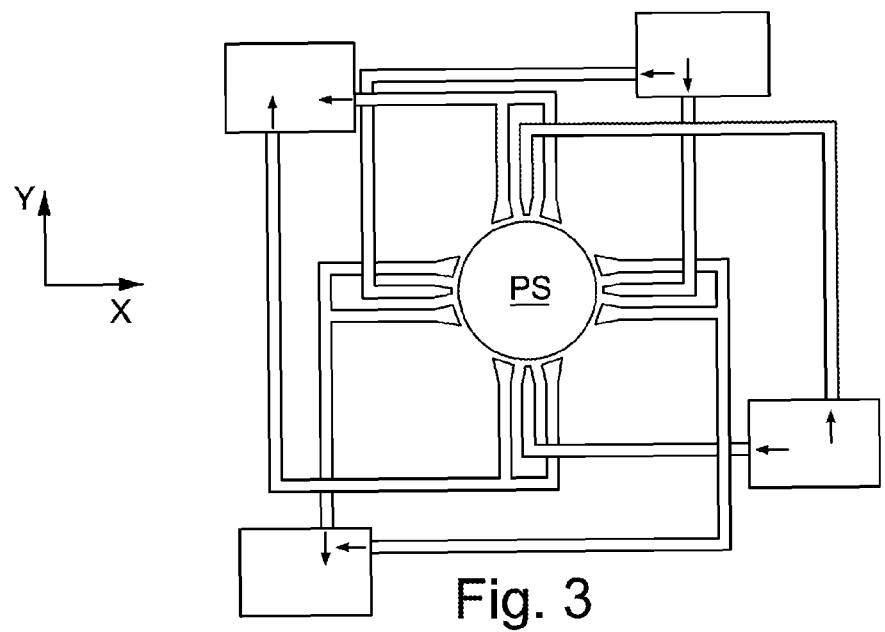
Fig. 3
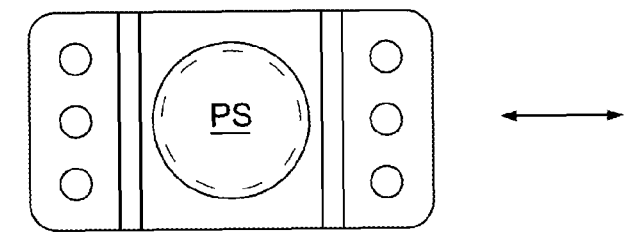
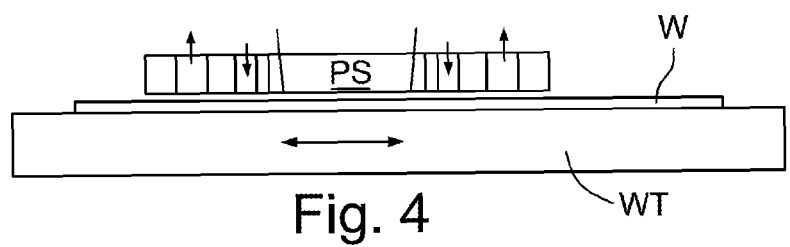
Fig. 4

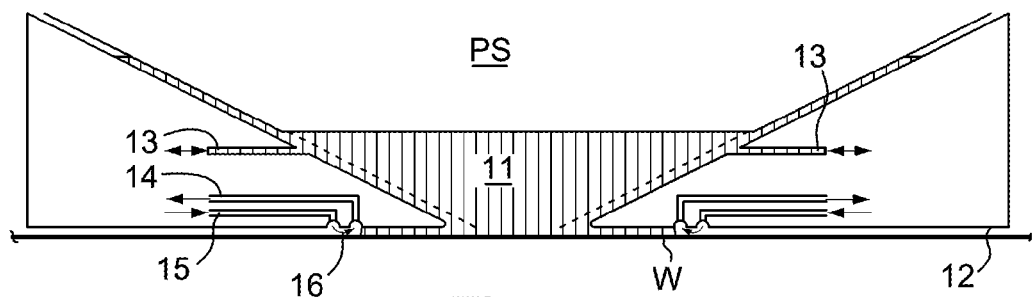
Fig. 5
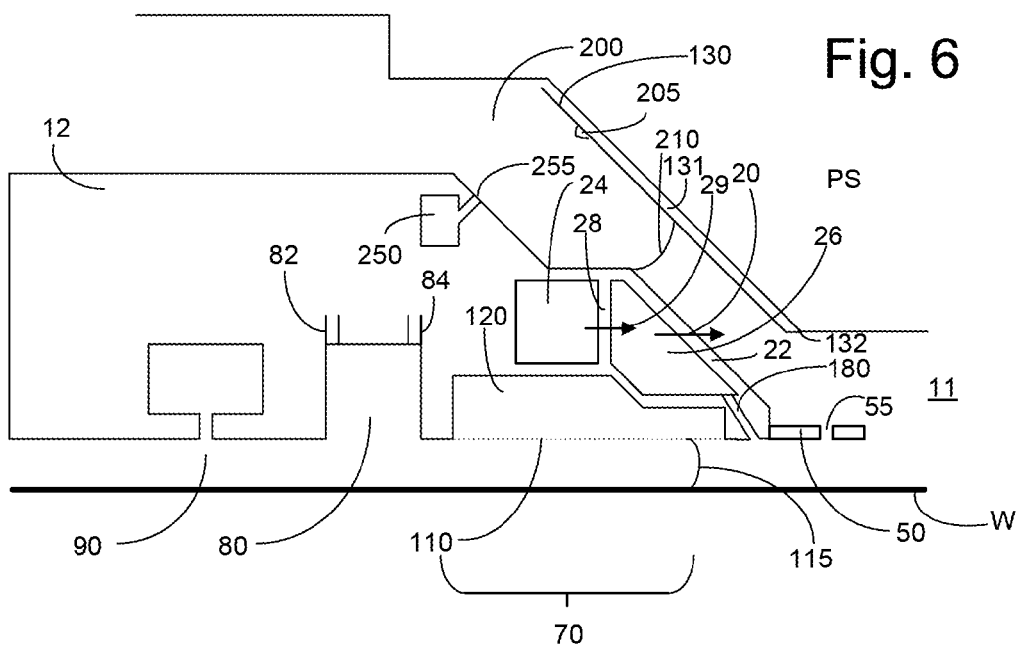
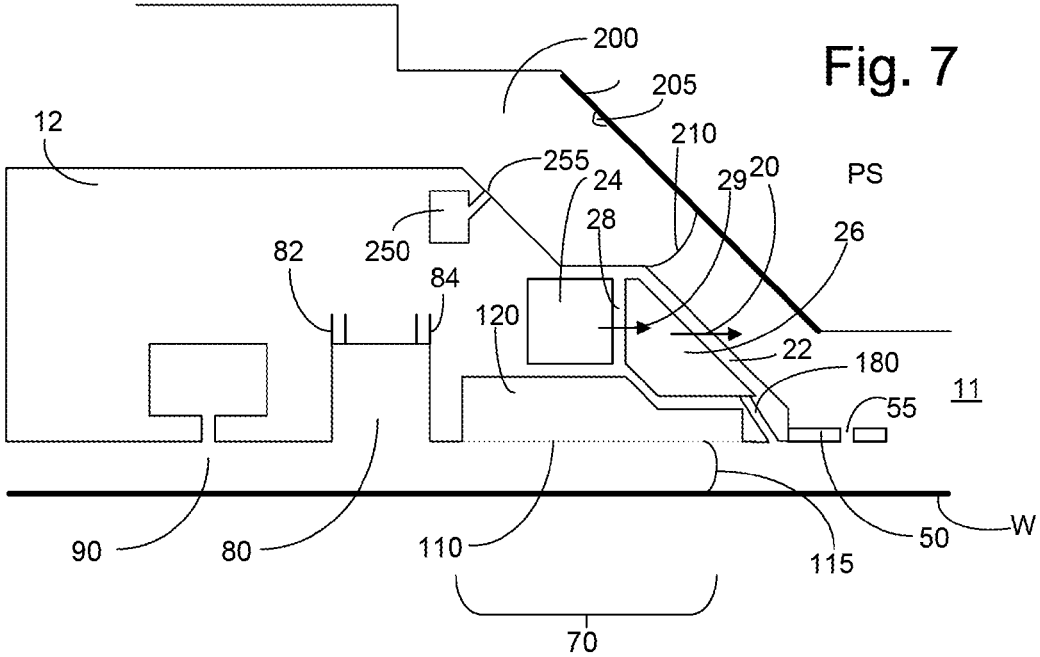

LITHOGRAPHIC APPARATUS AND A METHOD OF OPERATING THE APPARATUS

This application is a continuation of U.S. patent application Ser. No. 12/770,356, filed Apr. 29, 2010, which claims priority and benefit under 35 U.S.C. §119(e) to U.S. Provisional Patent Application No. 61/174,793, filed May 1, 2009. The entire content of each of the foregoing applications is incorporated herein by reference.

FIELD

The present invention relates to an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that should be accelerated during a scanning exposure. This may require additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid. The fluid handling system is located between the projection system and the substrate table.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, preferably along the direction of movement of the substrate relative to the final element. Liquid is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Note that arrows in FIGS. 2 and 3 show liquid flow as well movement of the substrate support.

A further immersion lithography solution with a localized liquid supply system is shown in FIG. 4. Liquid is supplied by two groove inlets on either side of the projection system PS and is removed by a plurality of discrete outlets arranged radially outwardly of the inlets IN. The inlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that arrows in FIG. 4 show liquid flow as well movement of the substrate support.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table is moved away from its exposure position to a position in which the substrate may be removed and replaced by a different substrate. This is known as substrate swap. In a two stage lithographic apparatus, the substrate tables swap may take place under the projection system. During, for example, substrate swap, immersion liquid may be retained between the final element and the surface of the substrate and/or substrate table, within the liquid confinement structure. In a multi stage, e.g. dual stage, apparatus the surface may change, for example, from the surface of a table to the surface of a different table.

PCT patent application publication no. WO 2005/064405 discloses an all wet arrangement in which the immersion liquid is unconfined. In such a system substantially the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table may prevent the liquid from escaping so that it can be removed from the top surface of the substrate table in a controlled way. Although such a system may improve temperature control and processing of the substrate, evaporation of the immersion liquid may still occur. One way of helping to alleviate that problem is described in United States patent application publication no. US 2006/119809. A member is provided which covers the substrate W in all positions and which is arranged to have immersion liquid extending between it and the top surface of the substrate and/or substrate table which holds the substrate.

In a fluid handling system or liquid confinement structure, liquid is confined to a space, for example within a confinement structure by the body of the structure, the underlying surface (e.g. a substrate table, a substrate supported on the substrate table, a shutter member and/or a measurement table) and, in the case of a localized area immersion system, a liquid meniscus between the fluid handling system or liquid confinement structure and the underlying structure i.e. in an immersion space. In the case of an all wet system, liquid is allowed to flow out of the immersion space onto the top surface of the substrate and/or substrate table.

SUMMARY

Droplets of liquid may splash onto a part of the final element of the projection system which is not normally in contact with immersion liquid in the immersion space. Such droplets can then evaporate forming cold spots on the last optical (e.g., lens) element leading to an imaging error and/or focusing error.

Also or alternatively, evaporation of liquid around the line defining the boundary between the liquid in the immersion space, gas and the final element of the projection system can have a strong effect on thermal disturbances on the final element of the projection system. This contact line can move due to sloshing of immersion liquid during relative motion between the liquid confinement structure and the substrate. When the line moves down a thin film of liquid can be left behind which evaporates and thermally disturbs the final element of the projection system.

It is therefore desirable, for example, to provide a system to reduce the effect of droplets and/or the gas-liquid-final element interface on the final optical element.

In an aspect, there is provided a lithographic apparatus comprising: a projection system; a liquid confinement structure configured at least partly to confine immersion liquid to an immersion space defined by the projection system, the liquid confinement structure and a substrate and/or substrate table; and a member adjacent an optically active part of a final element of the projection system, wherein, in normal use, the member is between immersion liquid and the optically active part.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a fluid handling structure as a liquid supply system for use in a lithographic projection apparatus;

FIG. 4 depicts a further liquid supply system for use in a lithographic projection apparatus;

FIG. 5 depicts, in cross-section, a liquid confinement structure which may be used in an embodiment of the present invention as a liquid supply system;

FIG. 6 depicts, in cross-section, a liquid confinement structure and projection system according to an embodiment of the invention;

FIG. 7 depicts, in cross-section, a liquid confinement structure and projection system according to an embodiment of the invention;

DETAILED DESCRIPTION

Figure 1:
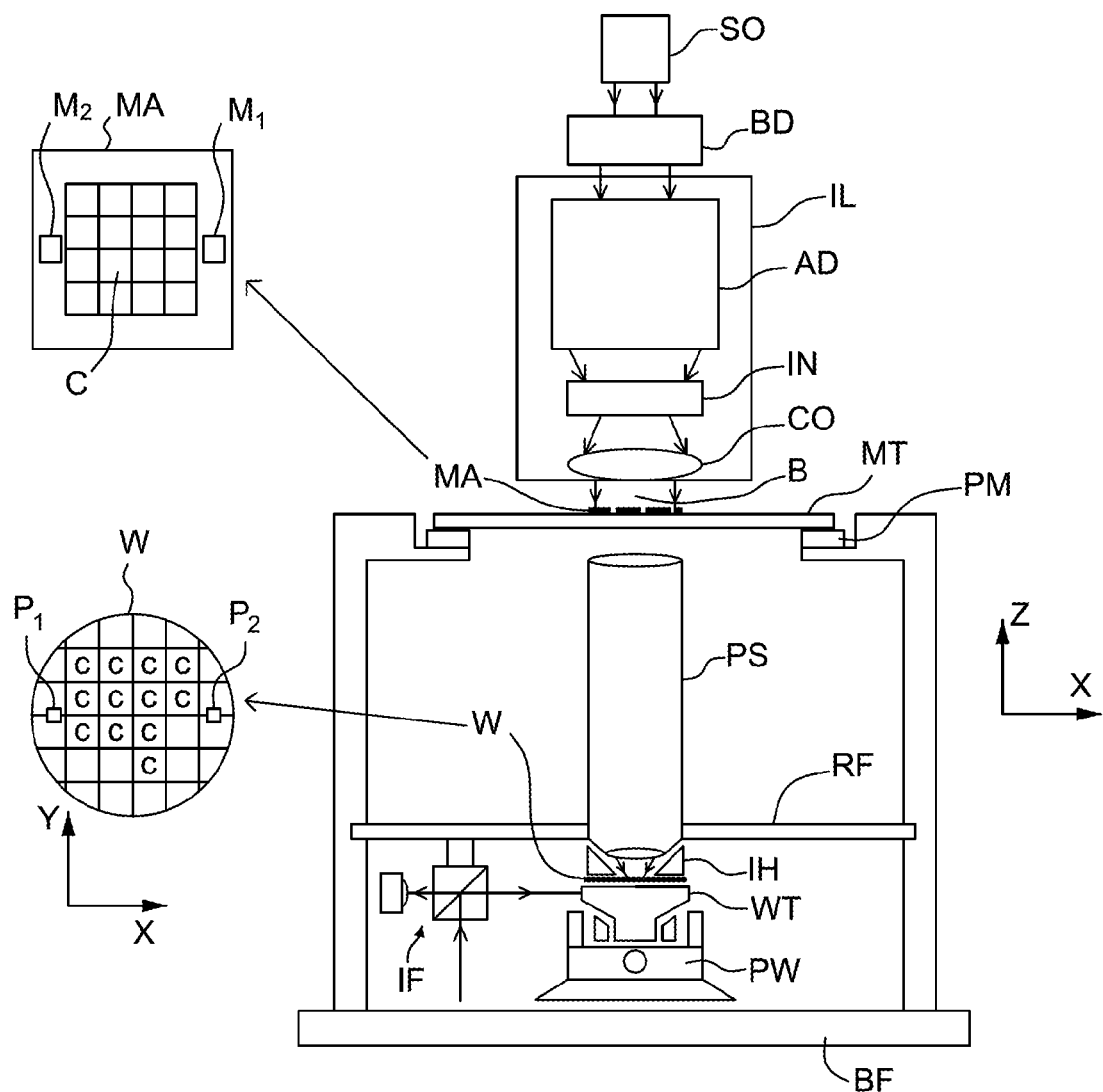
FIG. 1 depicts a lithographic apparatus according to an embodiment of the invention.

FIG. 1 schematically depicts a lithographic apparatus according to one embodiment of the invention. The apparatus comprises:
   an illumination system (illuminator) IL configured to condition a radiation beam B (e.g. UV radiation or DUV radiation);
   a support structure (e.g. a mask table) MT constructed to support a patterning device (e.g. a mask) MA and connected to a first positioner PM configured to accurately position the patterning device MA in accordance with certain parameters;
   a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as desired. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. The types of projection system may include: refractive, reflective, catadioptric, magnetic, electromagnetic and electrostatic optical systems, or any combination thereof. The selection or combination of the projection system is as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS. The projection system PS focuses the beam B onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An arrangement to provide liquid between a final element of the projection system PS and the substrate is the so called localized immersion system IH. In this system a liquid handling system is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of localized liquid supply systems are illustrated in FIGS. 2-5. The liquid supply systems disclosed in FIGS. 2-4 were described above.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). In an embodiment, a seal is formed between the liquid confinement structure and the surface of the substrate. The seal may be a contactless seal such as a gas seal. Such a system is disclosed in United States patent application publication no. US 2004-0207824, hereby incorporated in its entirety by reference.

FIG. 5 schematically depicts a localized liquid supply system with a liquid confinement structure 12. The liquid confinement structure 12 extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The liquid confinement structure 12 is substantially stationary relative to the projection system PS in the XY plane though there may be some relative movement in the Z direction (in the direction of the optical axis). In an embodiment, a seal is formed between the liquid confinement structure 12 and the surface of the substrate W and may be a contactless seal such as fluid seal, desirably a gas seal.

The liquid confinement structure 12 at least partly contains liquid in the immersion space 11 between a final element of the projection system PS and the substrate W. A contactless seal 16 to the substrate W may be formed around the image field of the projection system PS so that liquid is confined within the space 11 between the substrate W surface and the final element of the projection system PS. The immersion space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid is provided. In an embodiment, the liquid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

In an embodiment, the liquid is contained in the immersion space 11 by a gas seal 16 which, during use, is formed between the bottom of the liquid confinement structure 12 and the surface of the substrate W. Other types of seal are possible, as is no seal (for example in an all wet embodiment) or a seal achieved by capillary forces between the undersurface of the liquid confinement structure 12 and a facing surface, such as the surface of a substrate W, a substrate table WT or a combination of both.

The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in an immersion space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

Other arrangements are possible and, as will be clear from the description below, an embodiment of the present invention may use any type of localized liquid supply system as the liquid supply system.

One or more localized liquid supply systems seal between a part of the liquid supply system and a substrate W. The seal may be defined by a meniscus of liquid between the part of the liquid supply system and the substrate W. Relative movement of that part of the liquid supply system and the substrate W may lead to breakdown of the seal, for example the meniscus, and thereby leaking of liquid. The problem may be more significant at high scan velocities. An increased scan velocity is desirable because throughput increases.

FIG. 6 illustrates a liquid confinement structure 12 which is part of a liquid supply system. The liquid confinement structure 12 extends around the periphery (e.g., circumference) of the final element of the projection system PS in a plane parallel to the top surface of the substrate table and/or perpendicular to the optical axis such that the liquid confinement structure 12 (which is sometimes called a barrier member or seal member) is, for example, substantially annular in overall shape. That is, the liquid confinement structure 12 encloses the last optical (e.g., lens) element. The liquid confinement structure 12 may be an annulus and may be ring-shaped. The projection system PS may not be circular and the outer edge of the liquid confinement structure 12 may also not be circular so that it is not necessary for the liquid confinement structure 12 to be ring shaped. The liquid confinement structure 12 could also be other shapes so long as it has an opening through which the projection beam may pass out from the final element of the projection system PS. The opening may be centrally located. Thus, during exposure, the projection beam may pass through liquid contained in the opening of the liquid confinement structure 12 and onto the substrate W. The liquid confinement structure 12 may be, for example, substantially rectangular and may not be necessarily the same shape as the final element of the projection system PS is at the height of the liquid confinement structure 12.

The function of the liquid confinement structure 12 is at least partly to maintain or confine liquid in the space 11 between the projection system PS and the substrate W so that the projection beam may pass through the liquid. That space 11 is known as the immersion space. The top level of liquid is simply contained by the presence of the liquid confinement structure 12. The level of liquid in the space is maintained such that the liquid does not overflow over the top of the liquid confinement structure 12.

The immersion liquid is provided to the space 11 by the liquid confinement structure 12 (thus the liquid confinement structure 12 may be considered to be a fluid handling structure). A passageway or flow path for immersion liquid passes through the liquid confinement structure 12. Part of the flow path is comprised by a chamber 26. The chamber 26 has two side walls 28, 22. Liquid passes from chamber 24 through the first side wall 28 into chamber 26 and then through the second side wall 22 into the space 11. A plurality of outlets 20 provide the liquid to the space 11. The liquid passes through
through-holes 29, 20 in side walls 28, 22 respectively prior to entering the space 11. The location of the through holes 20, 29 may be irregular.

A seal is provided between the bottom of the liquid confinement structure 12 and the substrate W (this feature indicates that the liquid confinement structure 12 may be a fluid handling structure). In FIG. 6 a seal device is configured to provide a contactless seal and is made up of several components. Radially outwardly from the optical axis of the projection system PS, there is provided a (optional) flow control plate 50 which extends into the space 11 (though not into the path of the projection beam) which helps maintain substantially parallel flow of the immersion liquid out of outlet 20 across the space. The flow control plate 50 has through holes 55 in it to reduce the resistance to movement in the direction of the optical axis of the liquid confinement structure 12 relative to the projection system PS and/or substrate W.

Radially outwardly of the flow control plate 50 on the bottom surface of the liquid confinement structure 12 may be an inlet 180. The inlet 180 can provide liquid in a direction towards the substrate W. During imaging this may be useful in preventing bubble formation in the immersion liquid by filling a gap between the substrate W and substrate table WT with liquid.

Radially outwardly of the inlet 180 may be an extractor assembly 70 to extract liquid from between the liquid confinement structure 12 and the substrate W and/or the substrate table WT. The extractor assembly 70 will be described in more detail below and forms part of the contactless seal which is created between the liquid confinement structure 12 and the substrate W. The extractor assembly 70 may operate as a single phase or as a dual phase extractor.

Radially outwardly of the extractor assembly 70 may be a recess 80. The recess 80 is connected through an inlet 82 to the atmosphere. The recess 80 is connected via an outlet 84 to a low pressure source. The inlet 82 may radially outwardly positioned with respect to the outlet 84. Radially outwardly of the recess 80 may be a gas knife 90. An arrangement of the extractor assembly, recess and gas knife is disclosed in detail in United States patent application publication no. US 2006/0158627 incorporated herein in its entirety by reference. However, in that document the arrangement of the extractor assembly is different.

The extractor assembly 70 comprises a liquid removal device or extractor or inlet such as the one disclosed in United States patent application publication no. US 2006-0038968, incorporated herein in its entirety by reference. Any type of liquid extractor may be used. In an embodiment, the liquid removal device 70 comprises an inlet which is covered in a porous material 110 which is used to separate liquid from gas to enable single-liquid phase liquid extraction. A chamber 120 downstream of the porous material 110 is maintained at a slight under pressure and is filled with liquid. The under pressure in the chamber 120 is such that the meniscuses formed in the holes of the porous material 110 prevent ambient gas from being drawn into the chamber 120 of the liquid removal device 70. However, when the surface of the porous material 110 comes into contact with liquid there is no meniscus to restrict flow and the liquid can flow freely into the chamber 120 of the liquid removal device 70. The surface of the porous material 110 extends radially inwardly along the liquid confinement structure 12 (as well as around the space). The rate of extraction through the surface of the porous material 110 varies according to how much of the porous material 110 is covered by liquid.

The porous material 110 has a large number of small holes each with a dimension, e.g. a width, such as a diameter, $d_{hole}$ in the range of 5 to 50 μm. The porous material 110 may be maintained at a height in the range of 50 to 300 μm above a surface from which liquid is to be removed, e.g. the surface of a substrate W. In an embodiment, porous material 110 is at least slightly liquidphilic, i.e. having a contact angle of less than 90°, desirably less than 85° or desirably less than 80°, to the immersion liquid, e.g. water.

It may not always be possible to prevent gas being drawn into the liquid removal device 70 but the porous material 110 will prevent large uneven flows that may cause vibration. Micro-sieves made by electroforming, photoetching and/or laser cutting can be used as the porous material 110. Suitable sieves are made by Stork Veco B. V., of Eerbeek, the Netherlands. Other porous plates or solid blocks of porous material may also be used, provided the pore size is suitable to maintain a meniscus with the pressure differential that will be experienced in use.

During scanning of the substrate W (during which the substrate W moves under the liquid confinement structure 12 and projection system PS) the meniscus 115 extending between the substrate W and the liquid confinement structure 12 may be drawn either towards or away from the optical axis by a drag force applied by the moving substrate W. This can lead to liquid loss which may result in: evaporation of the liquid, cooling of the substrate W, and consequent shrinkage and overlay errors as described above. Liquid stains may also or alternatively be left behind from interaction between the liquid droplets and resist photochemistry.

Although not specifically illustrated in FIG. 6, the liquid supply system has an arrangement to deal with variations in the level of the liquid. This is so that liquid which builds up between the projection system PS and the liquid confinement structure 12 can be dealt with and does not spill. Such a build-up of liquid might occur during relative movement between the liquid confinement structure 12 and the projection system PS described below; such movement may be referred to as sloshing. One way of dealing with this liquid is to provide the liquid confinement structure 12 so that it is very large so that there is hardly any pressure gradient over the periphery (e.g., circumference) of the liquid confinement structure 12 during relative movement between the liquid confinement structure 12 and the projection system PS. In an alternative or additional arrangement, liquid may be removed from the top of the liquid confinement structure 12 using, for example, an extractor 250, such as a single phase extractor similar to the extractor assembly 70, having an outlet 255 opening to a space 200 between the liquid confinement structure 12 and the projection system PS. An alternative or additional feature is a liquidphobic (e.g., hydrophobic) coating. The coating may form a band around the top of the liquid confinement structure 12 surrounding the opening and/or around the last optical element of the projection system PS. The coating may be radially outward of the optical axis of the projection system PS. The liquidphobic (e.g., hydrophobic) coating helps keep the immersion liquid in the space 11.

An embodiment of the present invention will be described with reference to a liquid confinement structure 12 with the above mentioned structure. However, it will be apparent that any other type of liquid confinement structure or liquid handling system which provides liquid to an immersion space between the final element of the projection system PS and a substrate W may be applied in an embodiment of the invention. A liquid confinement structure or fluid handling system of both a localized area immersion lithographic apparatus and an all wet arrangement may be applied in an embodiment of the invention.

An embodiment of the invention is intended to help solve the problem of cold spots forming on the last element of the projection system caused by, for example, evaporating droplets. In an embodiment, a member is used which is placed adjacent an optically active part of a final element of the projection system PS. In use, the member is between the immersion liquid and the optically active part. Various embodiments are described in which the way in which the member reduces a temperature variation which would otherwise occur in the optically active part due to a thermal load caused by evaporation of the immersion liquid are different.

Desirably, a temperature variation in the optically active part due to evaporation of droplets of immersion liquid which are separate from the immersion liquid in the immersion space 11 is reduced. Desirably, a temperature variation in the optically active part due to evaporation of the immersion liquid in the immersion space 11, particularly at the interface between the liquid in the immersion space 11 and gas (e.g. at a meniscus 210 extending from the liquid confinement structure 12 and defining the extent of the immersion space 11), is reduced.

The member is configured to spread a heat load applied to a localized area of the member by immersion liquid on it onto an area of the optically active part greater than the localized area. The heat load may be applied either through droplets of the immersion liquid or through immersion liquid from the immersion space 11.

In the embodiments of FIGS. 6 and 7, the spreading of the heat load to an area greater than the localized area is achieved by thermal conduction. That is, the member is comprised of a material with a high thermal conductivity (for instance a material with a higher coefficient of thermal conductivity than the material of the optically active part of the projection system PS). In this way, a temperature variation on the member is quickly evened out by thermal conduction. In this way, the heat load applied on one side of the member is spread out before any significant effect is felt on the other side of the member (which is close to the optically active part of the projection system PS).

In order to help with thermal control of the member, an end of the member may be immersed, in use, in immersion liquid in the immersion space 11. That is, a meniscus 210 of immersion liquid in the immersion space 11 extends between the liquid confinement structure 12 and the member. This has an advantage that a temperature variation due to evaporation of immersion liquid at meniscus 210 can also be dealt with by the member. However, the member does not necessary extend this far down and may be only present to deal with droplets 205 of immersion liquid. In that case the member is not immersed in immersion liquid in the immersion space 11.

In the FIG. 6 embodiment, the final element of the projection system PS is comprised entirely of an optically active part. That is, the projection beam passes through all of the material of the final element of the projection system PS (contrast this to the embodiment of FIG. 9, described below).

A member 130 is positioned adjacent the optically active part of the final optical element of the projection system PS. The member 130 lies outside of the optical path of the apparatus. The member 130 surrounds the optical axis of the apparatus and the final element of the projection system PS around an outer edge. As illustrated, the member 130 does not extend to the bottom of the projection system PS and thereby lies outside of the optical path of the apparatus. The member 130 extends into the immersion space 11 so that a meniscus 210 of liquid in the immersion space 11 extends between the member 130 and the liquid confinement structure 12.

The member 130 may be spaced from the final element of the projection system PS. In this way, a gap 131 exists between the member 130 and the projection system PS. This gap 131 may be filled with gas or an insulator or may be maintained under a vacuum. The presence of the gap 131 helps in ensuring that a temperature variation which does occur in the member 130 is substantially not transmitted into the final element of a projection system PS. A seal 132 may be formed between an end of the member 130 and the final element of the projection system PS at the bottom of the projection system PS.

The member 130 may be attached to the final element of the projection system PS by adherence. For example, the member 130 could be glued to the front end of the projection system PS. Other means of fixing the member 130 to the final element of the projection system PS are possible. In an embodiment, the member 130 is not spaced from the final element of the projection system PS.

Any droplet 205 which lands on the member 130 can evaporate and thereby generate a heat load on the member 130. Because the member 130 is of a material with a high coefficient of thermal conductivity, any heat load will quickly be dissipated throughout the member 130. This heat dissipation can be aided by having the end of the member 130 immersed in immersion liquid in immersion space 11. This helps ensure the thermal stability of the member 130. That is, the member 130 is thermally conditioned by the immersion liquid.

FIG. 7 shows a further embodiment which is the same as FIG. 6 except as described below. In the FIG. 7 embodiment the member 130 of FIG. 6 is in the form of a coating 133. In the FIG. 7 embodiment there is no gap 131 between the member 133 and the final element of the projection system PS. In both embodiments of FIGS. 6 and 7 desirably the member 130, 133 is metallic.

Figure 8:
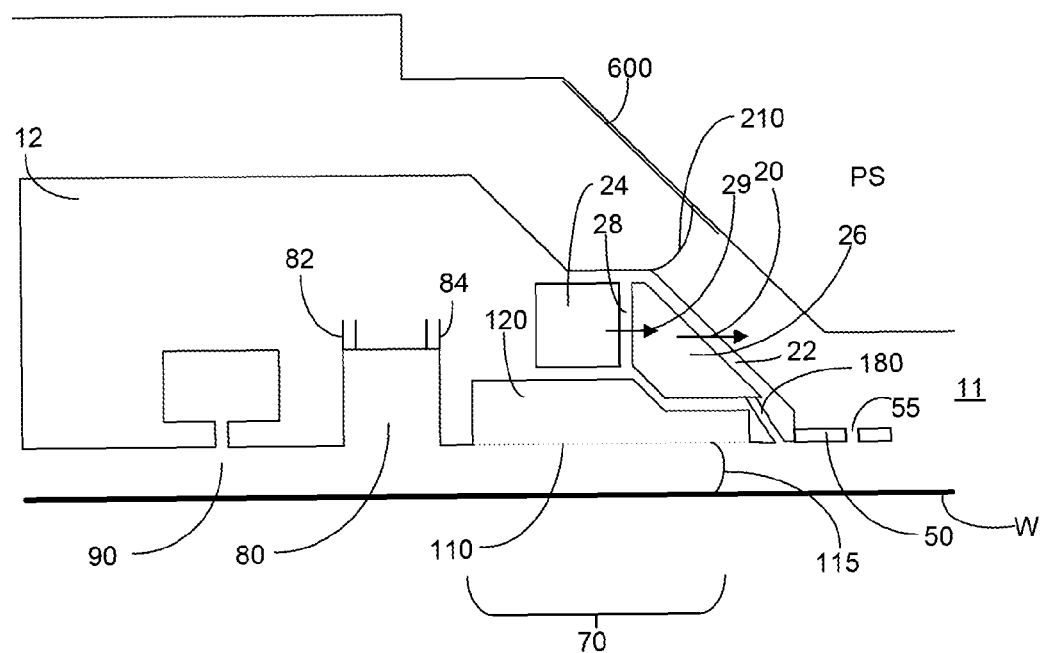
FIG. 8 depicts, in cross-section, a liquid confinement structure and projection system in accordance with an embodiment of the invention.

FIG. 8 shows a further embodiment. The embodiment of FIG. 8 is the same as the embodiment of FIG. 6 except as described below. In the embodiment of FIG. 8 immersion liquid is forced in a radially outward direction (all radial directions mentioned herein refer as an origin to the optical axis of the projection system PS). In this way evaporation of immersion liquid from the surface, e.g. downwardly facing surface, of the final optical element of the projection system PS is substantially constant. By maintaining immersion liquid in contact with that downwardly facing surface of the final optical element of the projection system PS evaporation from that downwardly facing surface of immersion liquid is substantially constant so that any heat load applied is substantially constant.

In order to force the immersion liquid in a radially outward direction use of capillary force and/or use of one or more liquidphilic surfaces may be made.

In the embodiment of FIG. 8, the member is a wetting medium 600 which may be a fibrous material 600 is provided on the projection system PS. The wetting medium 600 may be a sheet and may be in the form of a mesh or sheet mesh. The wetting medium 600 is attached to the final optical element of the projection system PS. For example the wetting medium 600 may be attached by adherence. The wetting medium 600 is positioned in an area where, for example, splashing of immersion liquid onto the final element of the projection system PS is likely.

The wetting medium 600 desirably extends to a position where its end is normally covered by immersion liquid in the immersion space 11. Capillary action draws liquid up into the wetting medium 600 from the immersion space 11. Thereby the wetting medium 600 is substantially always wet with immersion liquid. Thus, the wetting medium 600 forces immersion liquid in a radially outward direction (e.g. forces the liquid up) and in contact with a surface, e.g. a downwardly facing surface, of the final element of the projection system PS. The wetting medium 600 also maintains liquid in contact with the downwardly facing surface of the final element of the projection system PS radially outward of the meniscus 210 extending between the projection system PS and the liquid confinement structure 12.

Additionally or alternatively, any splashes of liquid which fall on the wetting medium 600 are quickly spread out. In this way a heat load applied by evaporation of that liquid is not applied to a small localized area (e.g., the area on which the droplet lands), but rather applied over a larger area covered by the wetting medium 600.

The wetting medium 600 may be any porous medium having adequate porosity/permeability (e.g. enough capillary force) to draw the liquid upwards. In an embodiment, the wetting medium 600 is a mesh.

In an embodiment, the wetting medium 600 is substantially always wet and liquid evaporates from it. This results in substantially saturated immersion liquid vapor being adjacent to the meniscus 210. Thus, in this embodiment, it is accepted that a thermal load is applied to the projection system PS but that thermal load is maintained substantially constant by arranging for the wetting medium 600 to be substantially constantly wet. Because the thermal load is substantially constant, this can be compensated for by other measures in known ways.

Figure 9:
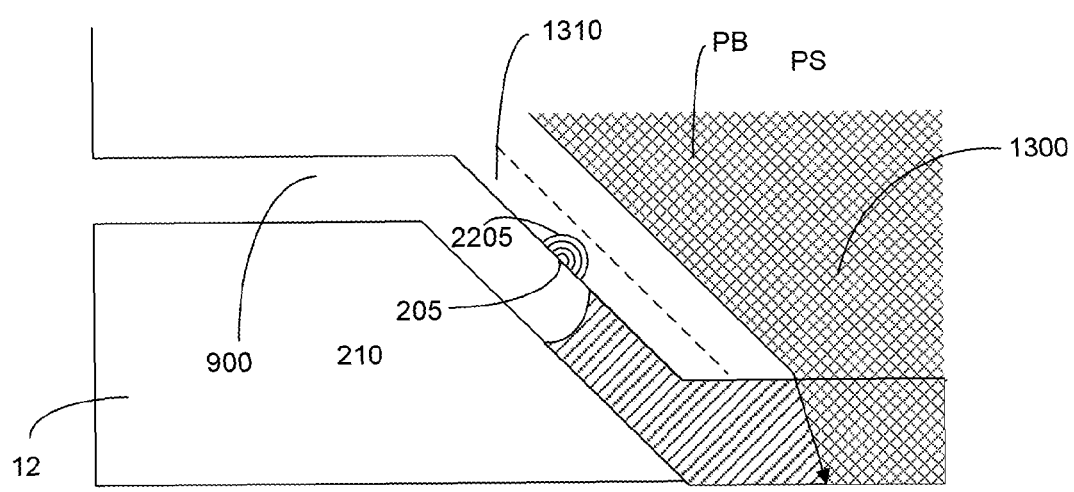
FIG. 9 depicts, in cross-section, a liquid confinement structure and projection system in accordance with an embodiment of the invention.

The embodiments of FIGS. 6-8 are described with the optically active part of the projection system PS extending to the edge of the final element of the projection system PS. However this is not necessarily the case and an optically inactive part may lie at the edge of the final element of the projection system PS. The optically inactive part can be seen as being similar to a member of any one of FIGS. 6-8. In the embodiment of FIG. 9, which is the same as FIG. 6 except as described below, advantage is taken of an optically inactive part 1310 of the final element of the projection system PS. The embodiments of any one of FIGS. 6-8 may be combined with the embodiment of FIG. 9 by providing the member 130, 133 or wetting medium 600 next to or spaced from the optically inactive part 1310.

The FIG. 9 embodiment works by insulating the optically active part 1300 of the projection system PS. This is achieved by making the final element of the projection system PS larger than it needs to be. The final optical element of the projection system PS comprises an optically active part 1300 through which the projection beam PB (illustrated by cross-hatching) passes and an optically inactive part 1310 which lies outside of the optical path of the apparatus. The optically inactive part 1310 surrounds the optical axis and the final element of the projection system PS around an outer edge. The optical element insulator does not extend to the bottom of the projection system PS and thereby lies outside of an optical path of the apparatus. The optically inactive part 1310 acts as an insulator to help ensure that a temperature variation 2205 which occurs, for example, due to an evaporating droplet 206, is substantially dampened out before it reaches the optically active part 1300 of the final optical element of the projection system PS. Thus, as in the embodiment of FIG. 6, the optically active part 1300 of the projection system PS is insulated from a thermal variation. The optically inactive part 1310 is desirably at least 3 mm thick.

Instead of making the final element of the projection system PS larger than necessary, it is also possible to apply a coating to the radially outer edge of the final element of the projection system PS outside of the optical path of the apparatus.

Desirably the lithographic apparatus comprises a liquid confinement structure which has a surface which surrounds the immersion space and at least partly defines a boundary of the immersion space. Desirably the liquid confinement structure is substantially stationary relative to the projection system. Desirably the liquid confinement structure confines liquid to a localized area of the top surface of the substrate.

The embodiments as shown in FIGS. 6-9 do not have any contact between the projection system PS and the liquid confinement structure 12. That is, the projection system PS and liquid confinement structure 12 and any structure between the projection system PS and the liquid confinement structure 12 and attached the projection system PS or liquid confinement structure 12 are spaced apart. In all embodiments at least one of the projection system PS and liquid confinement structure 12 is mechanically decoupled from the structure between the liquid confinement structure 12 and the projection system PS. There is no direct interconnecting structure between the projection system PS and the liquid confinement structure 12.

In an embodiment, there is provided a lithographic apparatus comprising a projection system, a liquid confinement structure configured at least partly to confine immersion liquid to an immersion space defined by the projection system, the liquid confinement structure and a substrate and/or substrate table, and a member adjacent an optically active part of a final element of the projection system, wherein, in normal use, the member is between immersion liquid and the optically active part.

Desirably the member is configured to reduce a temperature variation in the optically active part due to a thermal load caused by evaporation of immersion liquid. Desirably evaporation of immersion liquid is evaporation of droplets of immersion liquid and/or evaporation of immersion liquid in the immersion space. Desirably the member is configured to spread a heat load applied to a localized area of the member by immersion liquid on it onto an area of the optically active part greater than the localized area. Desirably the spreading is achieved by thermal conduction. Desirably the member is comprised of a material having a higher co-efficient of thermal conductivity than the material of the optically active part. Desirably the member is comprised of a metal. Desirably in use, a meniscus of immersion liquid extends between the liquid confinement structure and the member. Desirably the member is sealed to the final element at one end. Desirably the member is comprised of a material different to the material of the final element. Desirably the member is a coating. Desirably the member is spaced from the final element at least at a central portion. Desirably the member is in direct physical contact with the final element. Desirably the spreading is achieved by increasing the area in which any liquid from a droplet is in contact with the member. Desirably the increasing is by capillary action. Desirably the immersion liquid which is on the opposite side of the member to the optically active part is a droplet of immersion liquid which is separated from the immersion liquid in the immersion space.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Moreover, although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof.

In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention.

Thus, it is intended that the scope of the present invention herein disclosed should not be limited by the particular disclosed embodiments described above, but should be determined only by a fair reading of the claims that follow.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
a projection system comprising a final optical element, the final optical element having a bottom surface and a side surface that is located above the bottom surface and extends around the bottom surface;
a liquid confinement structure configured at least partly to confine immersion liquid to an immersion space defined by the projection system, the liquid confinement structure and a substrate and/or substrate table; and
a member at the side surface of the final optical element and adjacent an optically active part of the final optical element, wherein the member has an aperture at the bottom surface to allow radiation to pass through, the member, in normal use, is between immersion liquid and the optically active part, and the member is configured to spread out a thermal load applied on one side of the member before an effect thereof reaches another side of the member, the another side of the member facing the optically active part.

2. The lithographic apparatus of claim 1, wherein the thermal load is caused by evaporation of droplets of immersion liquid and/or evaporation of immersion liquid in the immersion space.

3. The lithographic apparatus of claim 1, wherein the spreading is achieved by thermal conduction.

4. The lithographic apparatus of claim 1, wherein the spreading is achieved by increasing the area in which any liquid from a droplet is in contact with the member.

5. The lithographic apparatus of claim 4, wherein the increasing is by capillary action.

6. The lithographic apparatus of claim 1, wherein the member is comprised of a material having a higher co-efficient of thermal conductivity than the material of the optically active part.

7. The lithographic apparatus of claim 1, wherein the member is sealed to the final element at one end.

8. The lithographic apparatus of claim 1, wherein the member is comprised of a material different to the material of the final element.

9. The lithographic apparatus of claim 1, wherein the member is spaced from the final element at least at a central portion.

10. The lithographic apparatus of claim 1, wherein the member is in direct physical contact with the final element.

11. The lithographic apparatus of claim 1, wherein, in normal use, an end of the member is immersed in the immersion liquid so as to thermally condition the member.

12. The lithographic apparatus of claim 11, wherein the member is open at the end.

13. A lithographic apparatus comprising:
a projection system;
a liquid confinement structure configured at least partly to confine immersion liquid to an immersion space defined by the projection system, the liquid confinement structure and a substrate and/or substrate table; and
a member adjacent an optically active part of a final element of the projection system, wherein the member, in normal use, is between immersion liquid and the optically active part, is configured to retain immersion liquid adjacent the final element, and is configured to draw immersion liquid by capillary action between an outer surface of the member and the optically active part.

14. The lithographic apparatus of claim 13, wherein the member comprises a porous or fibrous medium to retain immersion liquid adjacent the final element.

15. The lithographic apparatus of claim 13, wherein the member comprises a wetting medium to increase the area in which immersion liquid is in contact with the member.

16. The lithographic apparatus of claim 13, wherein, in normal use, an end of the member is immersed in the immersion liquid so as to thermally condition the member.

17. A lithographic apparatus comprising:
a projection system comprising a final optical element, the final optical element having a bottom surface and a side located above the bottom surface;
a liquid confinement structure configured at least partly to confine immersion liquid to an immersion space defined by the projection system, the liquid confinement structure and a substrate and/or substrate table; and
a member adjacent an optically active part of the final element and at the side surface of the final element, wherein the member, in normal use, is between immersion liquid and the optically active part and an insulator portion is located at the side surface of the final element between the member and the optically active part of the final element.

18. The lithographic apparatus of claim 17, wherein the insulator comprises a gas gap or a vacuum at least at a central portion of the member.

19. The lithographic apparatus of claim 17, wherein the member is comprised of a material having a higher co-efficient of thermal conductivity than the material of the optically active part and of the insulator.

20. The lithographic apparatus of claim 17, wherein, in normal use, the member has one end immersed in the immersion liquid and another end in a gaseous environment between the final element and the liquid confinement structure.

* * * * *